United States Patent [19]

Kenney

[11] 3,964,906

[45] June 22, 1976

[54] METHOD OF FORMING A HYDROPHOBIC SURFACE BY EXPOSING A COLLOIDAL SOL TO UV RADIATION

[75] Inventor: John Thomas Kenney, Lawrence Township, Mercer County, N.J.

[73] Assignee: Western Electric Company, Inc., New York, N.Y.

[22] Filed: Sept. 26, 1975

[21] Appl. No.: 617,258

Related U.S. Application Data

[62] Division of Ser. No. 424,015, Dec. 12, 1973, Pat. No. 3,949,121.

[52] U.S. Cl. ................................ 96/33; 96/36.2; 96/36.3; 96/88; 101/465; 427/54; 427/145; 427/301; 427/322; 427/437
[51] Int. Cl.² ........................................ G03F 7/02
[58] Field of Search ............... 96/33, 36.2, 38.4, 28, 96/88, 48 PD, 36.3; 204/30; 252/313 R; 427/98, 301, 54, 145, 322, 437; 101/465

[56] References Cited
UNITED STATES PATENTS

| | | |
|---|---|---|
| 3,437,507 | 4/1969 | Jensen ................................... 106/1 |
| 3,562,005 | 2/1971 | DeAngelo et al .................. 117/212 |
| 3,607,352 | 9/1971 | Fadgen ............................... 117/212 |
| 3,635,758 | 1/1972 | Schneble ............................ 117/212 |
| 3,793,072 | 2/1974 | Lando .................................. 427/98 |
| 3,873,357 | 3/1975 | Lando ................................ 106/1 X |
| 3,873,359 | 3/1975 | Lando ................................ 106/1 X |
| 3,873,360 | 3/1975 | Lando ................................ 106/1 X |

*Primary Examiner*—Edward C. Kimlin
*Attorney, Agent, or Firm*—J. Rosenstock

[57] ABSTRACT

A method of forming a hydrophobic surface is disclosed. The method comprises coating a substrate surface with a stable aqueous colloidal solution, formed by a controlled hydrolysis and nucleation reaction, comprising insoluble hydrous oxide particles of an element selected from Be, In, Cr, Fe, Co, Ni, Tl, Cu, Zn, Sn and mixtures thereof. The coated surface is then exposed to a source of ultraviolet radiation having a wavelength ranging from 1800A to 3300A to render exposed surface regions hydrophobic.

2 Claims, 4 Drawing Figures

METHOD OF FORMING A HYDROPHOBIC SURFACE BY EXPOSING A COLLOIDAL SOL TO UV RADIATION

This is a division of application Ser. No. 424,015, filed Dec. 12, 1973, now U.S. Pat. No. 3,949,121.

BACKGROUND OF THE INVENTION

1. Field of the Invention

The present invention relates to a method of forming a hydrophobic surface and more particularly, to a method of forming such a surface by exposure of the surface to a source of ultraviolet radiation.

2. Discussion of the Prior Art

For purposes of the instant disclosure, the terms wettable and hydrophilic are used synonymously and interchangeably with each other, as are the opposite terms non-wettable and hydrophobic. Moreover, hydrophilicity is indicated by the existence of a condition termed practical wetting.

Practical wetting is defined as the ability of a surface to retain, on a substantially macroscopically smooth, unroughened portion thereof, a continuous, thin, uniform layer of a liquid, such as water or other liquid medium, when the surface is held vertically, or in any other orientation. It should be noted that this definition does not necessarily refer to, nor depend on, contact angle, surface energy or surface tension. However, when practical wetting occurs, the contact angle goes to or closely approaches 0°. Thus, the term practical wetting encompasses all types of wetting, due to whatever cause or causes, that meet the above definition of the term.

Generally speaking, whether a surface is wet or not depends to a great extent on the surface (often termed free-surface or interfacial) energies or tensions of (1) the surface to be wet, (2) the liquid with which the surface is to be wet, (3) the surface-liquid interface, and (4) the surface-vapor and liquid-vapor interfaces.

Thus, water, which has a relatively high surface energy or tension, is unable to wet a polytetrafluoroethylene (Teflon - a T.M. of DuPont) surface or a polyethylene surface, both of which have very low surface energies or critical surface tensions. Water, however, will normally wet clean inorganic glasses which have a rather high surface energy or critical surface tension. Surface energies and tensions are extremely difficult to measure in many instances, and are often only qualitatively describable.

That the relative surface energies or critical surface tensions of a surface and a liquid are favorable to the occurrence of wetting has been traditionally indicated by, among other things, the character of the so-called contact angle and the presence of "spreading." The contact angle is that angle measured through a liquid droplet between (a) a flat surface on which the liquid droplet resides and (b) a line tangent to the envelope of the droplet where the envelope intersects the surface. However, there is some controversy as to the upper limits of contact angle size beyond which a condition of non-wetting is present. This controversy is one reason for the use herein of the term practical wetting, defined earlier.

An indicia of the non-wetting of a surface by a liquid occurs when the surface is immersed in a liquid and upon removal therefrom the liquid draws back (the liquid does not wet the surface). Specifically, if a drop of a liquid beads up and assumes a spherical or nearly spherical shape, the liquid does not wet the surface. On the other hand, if the droplet on the surface spreads out over the surface, the liquid wets the surface. It has usually been observed that where spreading occurs, $$\nu = 0°$$

at the surface-liquid interface. Obviously, this test is qualitative, and also presents difficulties where spreading is observed but the contact angle is greater than 0°.

The above definition and use of the term practical wetting eliminates differentiation of contact angle situations falling between the two extremes of 0° and 180°, or between situations such as that of water on Teflon or on clean glass. Moreover, the difficulties presented by the concurrence of spreading and of a contact angle greater than 0° are avoided. Instead, if a liquid is retained, in accordance with the above definition, practical wetting is present, contact angle, surface energy and other considerations aside. Conversely, if a liquid is not retained in accordance with the above definition, non-wetting occurs.

Hydrophilic materials such as glass, glazed or enameled articles, etc., are many times required to be hydrophobic, i.e., water repellent. For example, a common method of producing lithographic printing masters is by rendering selected portions either hydrophilic or hydrophobic (depending on the nature of a surface) whereby either an oil-based ink (non-aqueous) or a water-based ink is retained on the surface in a pattern. Such a technique is also employed to apply a conductive ink or an ink catalytic to electroless metal deposition in a pattern for the ultimate deposition of an electroless and/or an electroplated metal deposit thereon. Also it is customary to treat glass fibres with oils, waxes, etc., during manufacture in order to protect the glass surface from the effect of moisture and to prevent loss of tensile strength by abrasion. Another illustration of the deleterious effects of moisture is found in glass bodies for electrical insulating purposes which, when exposed to the weather, lose their high electrical surface resistance under wet conditions. This is particularly true in the case of glass fibres having an extremely large surface per unit volume. A material which would help to preserve the high electrical surface resistance is highly desirable. Many other illustrations of the harmful effects of moisture exist but are too well known to require further discussion here.

Primary objects of this invention are to (1) render normally non-water-repellent, i.e., wettable, base members water-repellent, i.e., non-wettable and (2) selectively render a surface (originally hydrophobic or hydrophilic) hydrophobic to obtain a hydrophobic pattern.

SUMMARY OF THE INVENTION

The present invention is directed to a method of forming a hydrophobic surface and more particularly, to a method of forming such a surface by exposure of the surface to a source of ultraviolet radiation. The method includes coating a surface (hydrophilic or hydrophobic with a suitable aqueous colloidal wetting solution, formed by a controlled hydrolysis and nucleation reaction, comprising insoluble hydrous oxide particles of an element selected from Be, In, Cr, Fe, Co, Ni, Tl, Cu, Zn, Sn and mixtures thereof, the particles having a size within the range of 10A to 10,000A and the hydrolysis reaction including at least (1) dissolution of a salt of the selected element in an aqueous medium and (2) maintenance of the pH of the aqueous medium at a point where no flocculate results. The thus coated surface is rendered hydrophilic, if it is not already in such a state. The coated surface is then exposed to a source of ultraviolet radiation to render such an exposed surface hydrophobic.

DESCRIPTION OF THE DRAWING

The present invention will be more readily understood by reference to the following drawing taken in conjunction with the detailed description, wherein.

DETAILED DESCRIPTION

The present invention is described primarily in terms of forming a hydrophobic surface pattern on a surface of an organic polymeric substrate (hydrophobic). However, it will be understood that such description is exemplary only and is for purposes of exposition and not for purposes of limitation. It will be readily appreciated that the inventive concept is equally applicable to rendering hydrophobic all surfaces, whether originally hydrophilic or hydrophobic, inorganic or organic, conductive or non-conductive, and such rendering may be done selectively in a pattern or over the entire surface of a selected substrate.

Figure 1:
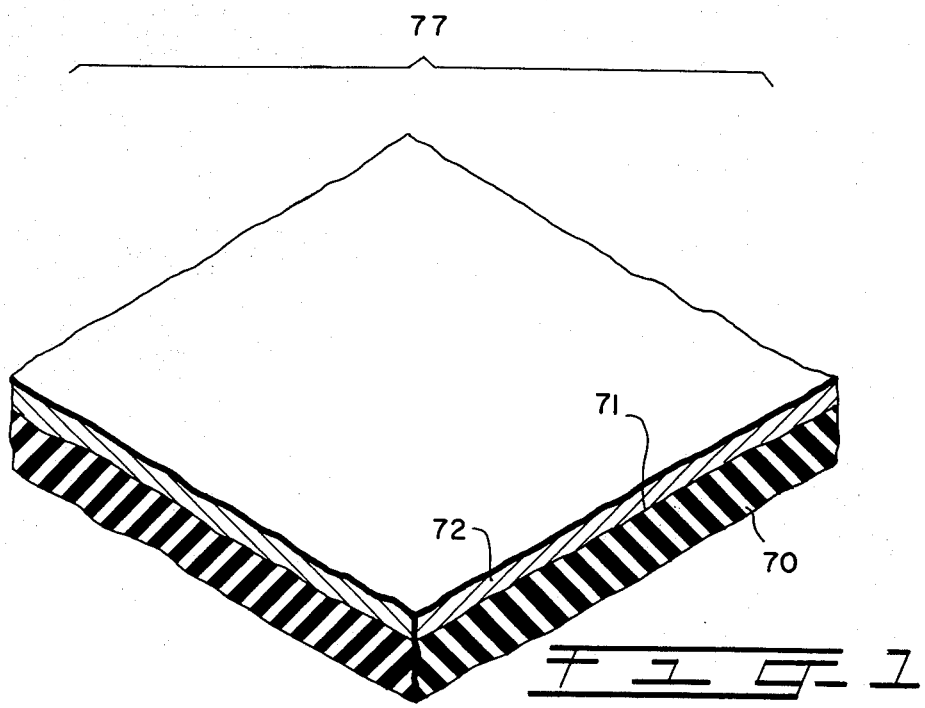
FIG. 1 is a partial isometric view of a portion of a typical substrate having a surface coated with a suitable colloidal wetting layer.

Referring to FIG. 1, a suitable substrate 70 is selected. A suitable substrate depends upon its ultimate use and may comprise either a hydrophobic or hydrophilic material which may or may not be electrically conductive. Some suitable hydrophobic materials which are non-conductors are organic polymers such as polytetrafluoroethylene (Teflon), polyesters (Mylar), polyimides (Kapton), epoxies, etc. Some typical hydrophilic materials are glass, glazed or enameled articles, porcelain, asbestos, quartz, mica, fabricated cementitious materials, metals, cellulosics containing hydroxyl groups (organics), etc.

A surface 71 of the substrate 70 is treated or exposed to a suitable wetting solution by any conventional means known in the art, e.g., dipping, spraying, brushing, etc., for a sufficient period of time, e.g., 1 to 300 seconds at 25°C, whereby the solution contacts and coats the entire surface to form a wetting layer or coat 72 (greatly enlarged for illustrative purposes only) containing a hydrous oxide of a selected element. The wetting layer 72 typically comprises a deposit ranging from 0.1 to 5 $\mu gm/cm^2$. Also the layer 72 is very adherent and will not peel under a standard cellophane-adhesive tape peel test (3–4 lbs./in. of pull.).

A suitable wetting solution includes some of the aqueous colloidal solutions revealed in Kenney, U.S. Pat. No. 3,657,003, filed Feb. 2, 1970, assigned to the assignee hereof and incorporated by reference herein, which are capable of rendering a hydrophobic surface hydrophilic. Such a solution is described as a stable colloidal solution formed by a controlled hydrolysis and nucleation reaction in an aqueous medium wherein colloidal particles of the colloidal wetting solution (1) have a size within the range of 10A to 10,000A and (2) comprise an insoluble hydrous oxide of one or more selected elements. The particular wetting solution selected must also have the ability of rendering a surface hydrophobic after application thereto and exposure thereof to a source of ultraviolet radiation. Suitable wetting solutions described in U.S. Pat. No. 3,657,003 are those havig colloidal particles comprising an insoluble hydrous oxide of one or more elements selected from the group comprising Be, Cr, Fe, Co, Ni, Cu, Zn, In, Tl and Sn.

The term hydrous oxide is defined for purposes of the present invention as an insoluble oxide, an insoluble hydroxide, an insoluble oxide-hydroxide, or an insoluble mixture of an oxide and a hydroxide.

Moreover, the term hydrous oxide as used herein is intended to include all permutations and combinations of one or more of the following types of oxides and/or hydroxides.

1. True Hydrous Oxides - Those oxides which include an indefinite amount of $H_2O$ in other than stochiometric fashion. That is, a salt of a selected element + hydrous $H_2O$.

2. True Hydroxides - Those compounds of a salt which contain actual OH—groups. That is, a salt of a selected element + only sufficient stochiometric $H_2O$ to form a hydroxide.

3. Hydrous Hydroxides - True hydroxides which also contain hydrous $H_2O$ in indefinite amounts. That is, a salt of a selected element + stochiometric $H_2O$ necessary to form a hydroxide + hydrous $H_2O$.

4. Hydrous Hydrates - A salt of a selected element + some of the stochiometric $H_2O$ necessary to form a hydroxide + hydrous $H_2O$.

A more detailed explanation of the term hydrous oxide is contained in *Inorganic Colloid Chemistry* by H. B. Weiser, Vol. II, "The Hydrous Oxides and Hydroxides," Chapter I, John Wiley and Sons, Inc., New York (1935); *Inorganic Chemistry, An Advanced Textbook* by T. Moeller, John Wiley and Sons, Inc., New York (1952); and *Advanced Inorganic Chemistry*, 3d. Ed., by F. A. Cotton and G. Wilkinson, Interscience Publishers (1972).

It should be noted that the term hydrous $H_2O$ refers to water carried by the compound in other than stochiometric fashion. Specifically, such water is probably not carried in chemical fashion but is rather surface sorbed, occluded or held as a part of the unit crystal.

The hydrolysis reaction includes dissolving a salt of the selected element in the aqueous medium and maintaining the pH of the aqueous medium at a point where no flocculate results.

Specifically, the following solutions disclosed in U.S. Pat. No, 3,657,003 are some suitable colloidal wetting solutions for the purposes of this invention:

1. The colorless (light, milky white) colloidal wetting solution of Example I-A which is obtained by (a) dissolving ½ weight percent of beryllium chloride [$BeCl_2$] in 100 ml. of deionized water and (b) raising the initial pH of 3.0 to a value of 5.6–5.8 by adding dilute $NH_4OH$ ($H_2O$ dilution of 1/20) thereto;

2. The wetting solution of Example VI which is obtained by (a) dissolving ½ weight percent of green chromic chloride [$CrCl_3 \cdot 6H_2O$], but probably more properly [$Cr(H_2O)_4Cl_2$7 $Cl \cdot 2H_2O$ or [$Cr(H_2O)_5Cl$]6 $\cdot H_2O$] in 100 ml. of deionized water and (b) raising the initial pH of the resultant solution to about 5 with a univalent alkali;

3. The tan wetting solution of Example X-A which is obtained by dissolving 1 weight percent of ferric chloride [$FeCl_3 \cdot 6H_2O$] in 100 ml. of deionized water, the dissolution being aided by gradually heating to about 50–80°C and stirring to obtain a wetting solution at a pH of 1.7–1.9;

4. The wetting solution of Example X-B which is obtained by (a) dissolving 0.5–5 weight percent of ferric chloride [$FeCl_3 \cdot 6H_2O$] in 100 ml. of deionized water, (b) adjusting the final pH of the resultant solution to about 1.5–2.0 with ether HCl (at low ferric chloride concentrations) or NaOH (at high ferric chloride concentrations) and (c) heating the solution to 70°C within 20 minutes;

5. The wetting solution of Example XXII-A which is obtained by (a) dissolving 1 weight percent of indium trichloride [$InCl_3$] in 100 ml. of deionized water and (b) raising the pH of the resultant solution to about 3 with NaOH; and 6. The whitish wetting solution of Example XXII-B which is obtained by (a) dissolving ½ weight percent of indium monochloride [$InCl$] in 100 ml. of deionized water and (b) raising the pH to bout 3.9 with dilute (factor of 20 with $H_2O$) $NH_4OH$.

Other suitable colloidal wetting solutions are prepared as follows:

1. One weight percent of $CoCl_2 \cdot 6H_2O$ is dissolved in 100 ml. of deionized water and the initial pH is raised to 7.9 by the addition of $NH_4OH$ (1N) to yield a colloidal wetting solution comprising hydrous oxide particles of cobalt;

2. One-half to 2 weight percent of nickel acetate is dissolved in 100 ml. of deionized water and the initial pH is raised to 8.2–8.4 by the addition of $NH_4OH$ (1N) to yield a blue colloidal wetting solution comprising hydrous oxide particles of nickel;

3. One weight percent of $TlCl_3$ is dissolved in 100 ml. of deionized water and the initial pH is raised to 3.7 by the addition of NaOH (1N) to yield a brown colloidal wetting solution comprising hydrous oxide particles of thallium;

4. One weight percent of $CuCl_2$ is dissolved in 100 ml. of deionized water and the initial pH is raised to 7.4–7.8 by the addition of $NH_4OH$ (1N) to yield a colloidal wetting solution comprising hydrous oxide particles of copper;

5. One weight percent of $ZnCl_2$ is dissolved in 100 ml. of deionized water and the initial pH is raised to 4.5–4.7 to yield a white colloidal wetting solution comprising hydrous oxide particles of zinc; and 6. One weight percent of $SnCl_4 \cdot 5H_2O$ is dissolved in 100 ml. of an aqueous solution comprising 0.5 moles of HCl. The pH is then raised to 0.9–1.4 by the addition of NaOH (1N) thereto to yield a colloidal wetting solution comprising hydrous oxide particles of tin.

Referring again to FIG. 1, the surface 71, having the colloidal wetting solution layer 72, is now hydrophilic, whether it was originally hydrophilic or hydrophobic. The surface 71, having layer 72 thereon, is dried, e.g., air dried, and then exposed to a radiation source 77, e.g., an ultraviolet radiation source having a wavelength ranging from 1800A to 3300A for a period of time sufficient to render the exposed surface hydrophobic. Such a period of time is readily ascertained experimentally by one skilled in the art, in the light of the present invention, for a particular ultraviolet radiation source. The amount of energy supplied to the coated substrate surface 71 by the ultraviolet radiation source 77, however, is not found to be critical and a typical energy exposure may range from 10 to 100 millijoules/$cm^2$ (at wavelengths ranging from 1800A to 3000A).

Upon exposure to the radiation source 77 the coated surface 71 is rendered hydrophobic. There is no explanation for this phenomenon. It is not known what photoreaction takes place or what product, if any, is obtained by such a photoreaction. It is hypothesized, however, that the photoreaction coverts the hydrous oxide deposit from a hydrophilic to a hydrophobic oxide by eliminating water therefrom.

Figure 2:
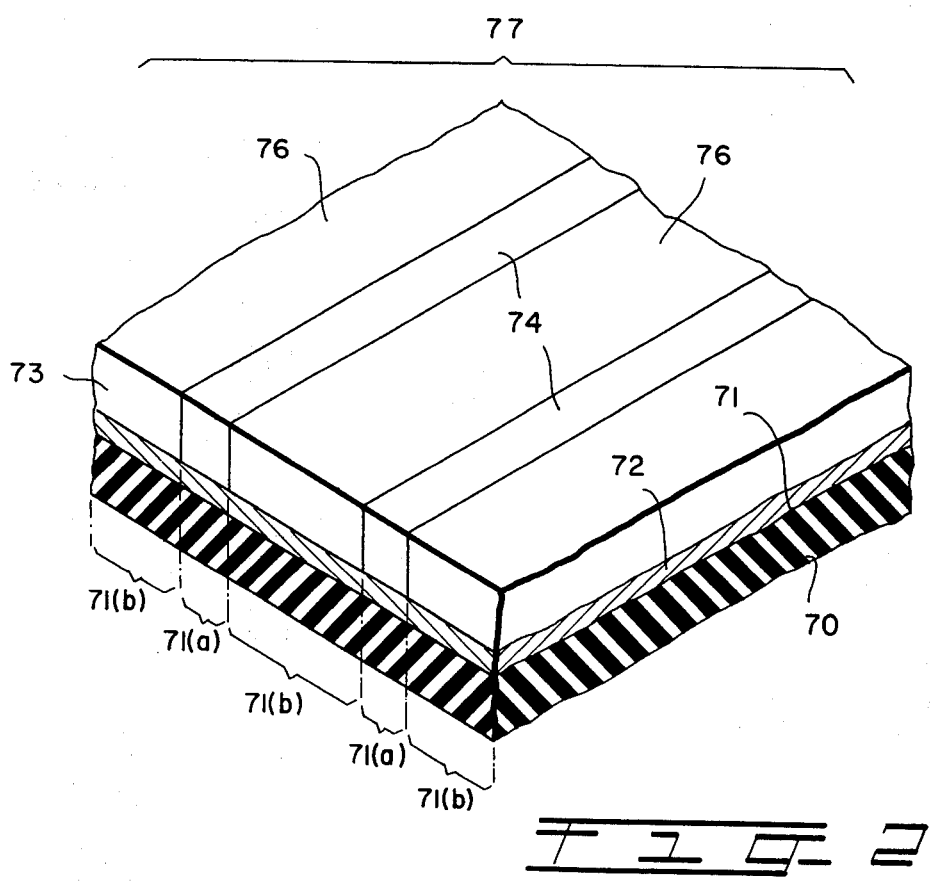
FIG. 2 is a partial isometric view of the coated portion of the substrate of FIG. 1 having a suitable mask placed contiguous thereto.

Referring to FIG. 2, where a hydrophobic pattern is desired, as for example for a lithographic printing master, a suitable mask 73 is placed contiguous to the dried wetting hydrous oxide layer 72 coating surface 71 of the suitable substrate 70, e.g., a sheet of treated paper, plastic, etc. The mask 73 is a negative mask, i.e., has areas 74 which are capable of transmitting therethrough the desired radiation to which the negative mask 73 and, ultimately, layer 72 is destined to be exposed. The areas 74 correspond to a desired ink pattern, i.e., a surface area pattern to which a printing ink is desired to adhere to. The negative mask 73 has areas 76 which are opaque to the desired radiation to which the negative mask 73 and layer 72 is destined to be exposed. It should be noted that in the alternative, separate masking areas may be applied to layer 72, utilizing standard materials and techniques known in the art.

The radiation source 77, e.g., an ultraviolet radiation source, is placed above the mask 73 and directed thereat. A plurality of rays, e.g., rays having a wavelength ranging from 1800A to 3300A, passes through or is transmitted through areas 74 of the mask 73 to expose coated areas 71(a) of the substrate 70 thereto. The thus exposed areas 71(a) of the substrate 70, underlying and corresponding to areas 74 of the negative mask 73 are rendered hydrophobic. The remaining areas 71(b), coated by layer 72, corresponding to areas 76 of the negative mask 73, which have not been exposed remain unchanged and are still hydrophilic.

Figure 3:
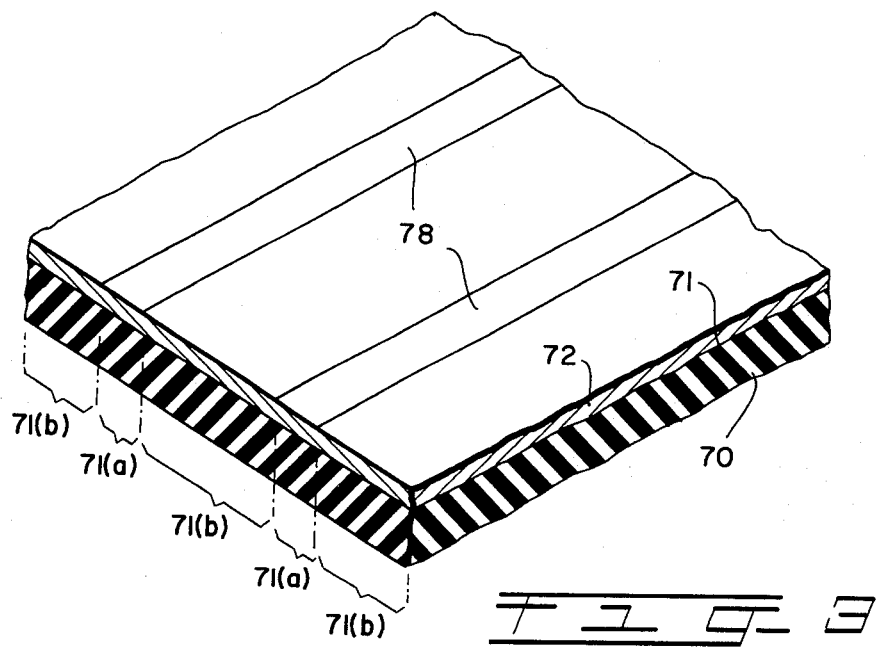
FIG. 3 is a partial isometric view of the portion of the substrate of FIG. 2 after an ink pattern has been deposited thereon.

Referring to FIG. 3, the radiation-exposed substrate 70 is treated by or exposed to a water spray or rinse by any conventional means, e.g., immersion, spraying, brushing, etc. When the water is applied to the substrate or master 70, only the hydrophilic areas 71(b) and not the hydrophobic areas 71(a) thereof will receive the water and be wetted thereby. A standard non-aqueous or oleophilic printing ink is then applied to the substrate or master 70 adhering only to the exposed areas 71(a) to form an ink pattern 78 for subsequent printing.

For the purposes of this invention, a standard non-aqueous or oleophilic printing ink is a mixture comprising a coloring matter, an oil or resin, plus a solvent, called the vehicle, that can be printed and that can also be dried. Such inks readily wet hydrophobic or oleophilic rather than hydrophilic surfaces. It is to be noted tht the various typical printing inks are well known in the art and will not be elaborated herein. Reference in this regard is made to *Industrial Printing Inks*, Louis M. Larsen, Reinhold Publishing Corporation, 1962.

It is to be noted that the above-described procedure for applying a printing ink pattern to the surface may be employed to obtain a conductive pattern on a dielectric substrate 70. Instead of a standard printing ink, a conductive ink or paint is employed. Conductive inks or paints are well known in the printed circuit art and in general typically comprise (1) a conductive constituent, such as for example graphite, powdered metals, e.g., Ag, Pt, Pd, Au, Cu, noble metal salts, e.g., silver oxide, silver nitrate, organic constituents of noble metals, e.g., noble metal resinates, etc.; (2) a binder such as for example synthetic resins, phenolics, essential oils (lavender oil), aldehydes, vegetable oils, e.g., linseed, cottonseed, china, soybean, castor oil, etc.; and (3) an organic solvent such as alcohol, acetone, ethyl acetate, butyl acetate, cellosolve acetate, carbitol acetate, amyl acetate, turpentine, butyl cellosolve, etc.

Figure 4:
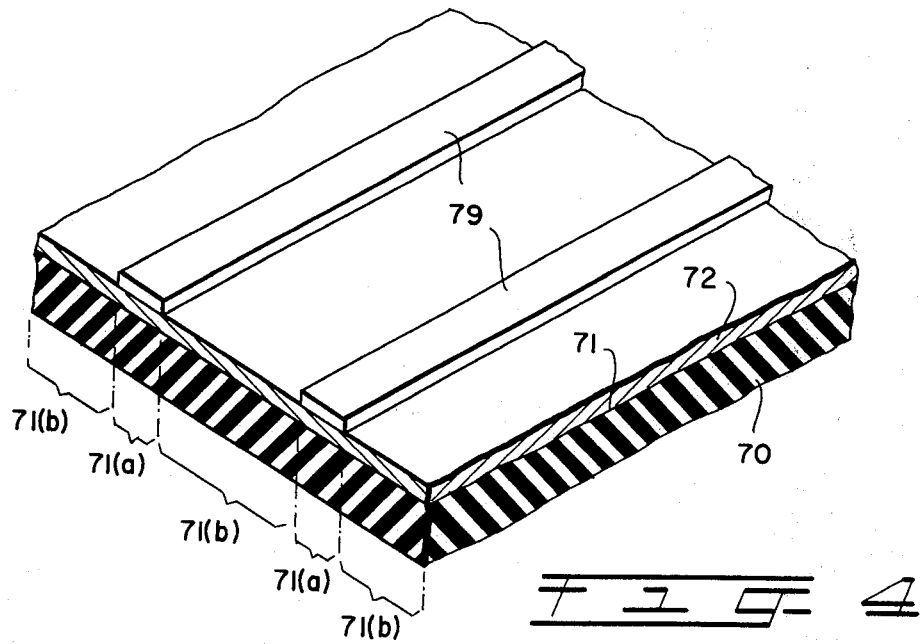
FIG. 4 is a partial isometric view of the portion of the substrate of FIG. 3 after a metallic pattern has been deposited thereon.

Referring again to FIG. 3, subsequently to the water rinse, the conductive ink is applied to the coated surface 71 to form the ink pattern (conductive) 78. The conductive ink pattern 78 may then be subjected to a conventional electroplating treatment, whereby an electroplated metal deposit 79, e.g., Cu, is obtained as illustrated in FIG. 4.

It is to be noted that a water-based ink may be employed for the purposes of a lithographic printing master. Referring back to FIG. 2, the suitable mask 73 selected and placed contiguous to the hydrous oxide layer 72 is a positive mask. The positive mask has areas 74 which are incapable of transmitting therethrough the desired radiation and areas 76 which are opaque to the desired radiation to which the positive mask and layer 72 is destined to be exposed. The radiation source 77 is placed above the mask 73 and directed thereat whereby a plurality of rays, e.g., ultraviolet rays, passes through or is transmitted through areas 76 to expose areas 71($b$) of the substrte 70, underlying and corresponding to areas 76 of the positive mask 73. The thus exposed areas 7($b$) are now rendered hydrophobic.

Referring again to FIG. 3, the substrate 70 is then treated with a water-based ink, e.g., a dilute polyvinyl alcohol solution with a coloring pigment such as $TiO_2$ and $ZrO_2$ contained therein. When the water-based ink is applied, the substrate or master 70 will receive the ink only in the unexposed areas 71($a$) [which have remained hydrophilic] to form the ink pattern 78 for subsequent printing. Again, it is to be noted that the water-based ink may be conductive and a metal pattern 79 may be obtained as illustrated in FIg. 4.

It is to be noted at this point that where the conductive ink (aqueous, non-aqueous) pattern 78 (FIG. 3) comprises therein particles of an activating metal, e.g., Pd, Pt, Ag, Au, the printed surface 71 may be immersed in a conventional electroless plating bath, catalyzed by the activating metal, to obtain an electroless metal deposit 79 (FIG. 4) which in turn may be further electroplated to a desired thickness.

It is to be noted hereat that the various typical electroless and electroplating solutions, plating conditions and procedures are well known in the art and will not be elaborated herein. Reference in this regard is made to *Metallic Coating of Plastics*, William Goldie, Electrochemical Publications, 1968.

For an alternative embodiment of the present invention, where a conductive pattern is desired, as for example in printed circuit manufacture, reference is again made to FIG. 2. Placed contiguous to the wetting hydrous oxide containing layer 72 is the positive mask 73 having areas 74 which are opaque to the desired radiation and areas 76 which are capable of transmitting therethrough the desired radiation. Again, alternatively, separate masking areas may be applied to layer 72 utilizing standard materials and techniques known in the art.

The radiation source 77, e.g., an ultraviolet source, is placed above the mask 73 and directed thereat. A plurality of rays passes through or is transmitted through areas 76 of the mask 73 to expose coated areas 71($b$) of the surface 71 to render such areas hydrophobic. The unexposed coated areas 71($a$) of the surface 71, corresponding to areas 74 of the positive mask 73, remain hydrophilic.

Next, the selectively exposed coated surface 71 is sensitized. Sensitization comprises depositing on the coated surface 71 a sensitizing species which is readily oxidized, e.g., $Sn^{+2}$, $Ti^{+3}$, $Pb^{+2}$ ions. Typically, the selectively exposed surface is immersed into a standard or conventional aqueous sensitizing solution, e.g., comprising aqueous stannous chloride. Again, it is to be understood that the conventional aqueous sensitizing solutions which are non-wetting, i.e., which will not render a hydrophobic surface hydrophilic and/or which will not wet a hydrophobic surface, are well known in the art and will not be elaborated herein but reference is again made to *Metallic Coating of Plastics*, William Goldie, Electrochemical Publications, 1968.

When the aqueous sensitizing solution, e.g., aqueous stannous chloride, comes in contact with the coated surface 71, the hydrophilic areas 71($a$) retain the aqueous sensitizer solution whereas the hydrophobic areas 71($b$) do not, thereby leading to a sensitizer pattern corresponding to areas 74 of the positive mask 73.

After sensitizing the coated surface 71 to form a sensitized pattern, the sensitized surface 71 is rinsed then activated. It is to be noted that it is important that the sensitized surface 71 be rinsed thoroughly in a cleaning medium, e.g., water, after sensitizing to remove excess sensitizer. If such is not done, excess sensitizer on the areas 71($a$) may cause reduction of an activating species to which the sensitized surface is destined to be exposed, in non-adherent form on the areas 71($a$) and/or lead to a resultant poorly delineated metallic pattern destined to be deposited. Activating relates to providing a deposit of a catalytic metal, e.g., Pd, over the areas 71($a$), in sufficient quantities to successfully catalyze a plating reaction once the areas 71($a$) are introduced into an electroless plating bath. The sensitized surface 71 is exposed to the activating solution, containing an activating metal ion, e.g., a noble metal ion. The sensitizing species, e.g., $Sn^{+2}$ is readily oxidized therein and the noble metal ion, e.g., $Pd^{+2}$, is reduced to the metal, e.g., Pd, which in turn is deposited on the surface 71 and areas 71($a$). The deposited activating metal, e.g., Pd, acts as a catalyst for localized further plating. Again, it is to be understood that the various activating metal ions and their solutions and the conditions and procedures of activation are well known in the art and will not be elaborated herein. Such activators and procedures may be found in part, in *Metallic Coating of Plastics*, previously referred to.

Figure 5:
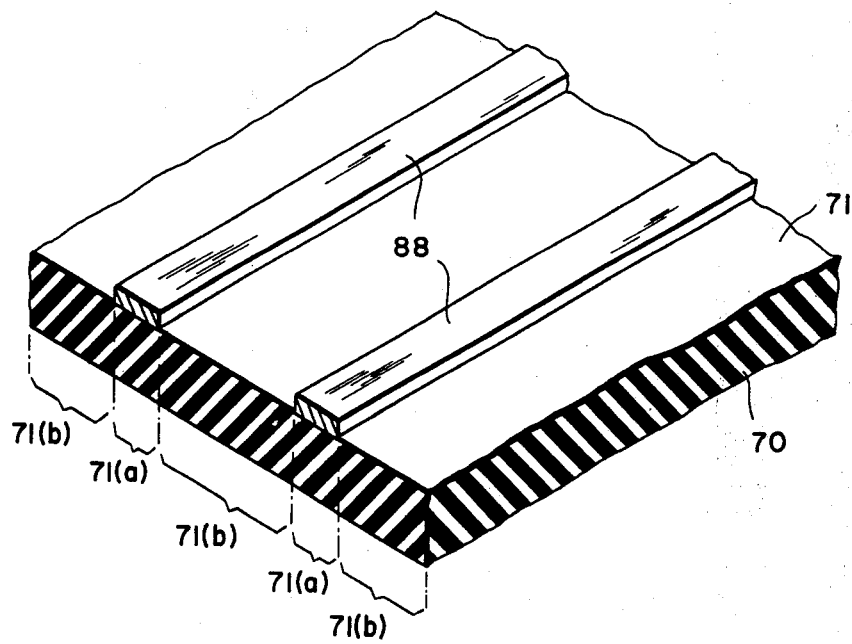
FIG. 5 is a partial isometric view of the portion of the substrate of FIG. 2 after a typical electroless metal deposition thereon.

After the activating step, the activated surface 71 is immersed in a standard electroless plating bath containing a metal ion, e.g., $Cu^{+2}$, destined to be reduced by the catalytic metal species, e.g., Pd. The metal ion, e.g., $Cu^{+2}$, is reduced by the catalytic metal, e.g., Pd, and is electrolessly deposited on the surface 71 on areas 71(a) to form an electroless metal pattern 88 as illustrated in FIG. 5. Again it is to be pointed out that the electroless baths, the electroless plating conditions and procedures are well known in the art and will not be elaborated herein. Reference is again made to *Metallic Coating of Plastics*, previously referred to, for some typical examples of electroless baths and plating parameters. The electroless metal-deposited substrate 70 may then be subjected to a conventional electroplating treatment to build up the electroless metal deposit. It is, of course, understood that the electroplating step is optional and can be eliminated.

EXAMPLE I

For comparison purposes a clean hydrophilic glass slide, a hydrophobic polyethylene terephthalate film, a hydrophobic polyimide film and a hydrophobic polytetrafluoroethylene film, all of which were commercially obtained, were immersed in a water bath for a period of time ranging from about 1 second to about 5 minutes at a temperature of 25°C. The slide and films were then removed from the water bath.

The surfaces of the glass slide were wet by the water, i.e., there was neither beading of the water on the surface nor drawing back of the water, but on the contrary, a thin uniform layer of water was formed on the surfaces thereof. All three of the hydrophobic films exhibited either beading of the water or a drawing back of the water (a thin uniform covering layer of water was not evidenced).

EXAMPLE II

A colloidal wetting solution was prepared in the following manner. One-half weight percent of beryllium chloride [$BeCl_2$] was dissolved in 100 ml. of deionized water. The pH of the resultant solution was raised from 3.0 to 5.6–5.8 by adding dilute $NH_4OH$ ($H_2O$ dilution of 1/20) thereto to obtain a wetting solution comprising colloidal particles of a hydrous oxide of beryllium.

The hydrophilic glass slide and the hydrophobic polyethyleneterephthalate and polyimide films of Example I were immersed in the resultant wetting solution at 25°C for about 10 to 30 seconds. The polytetrafluoroethylene film of Example I was immersed in the wetting solution for about 5 minutes. The films and slide were removed and rinsed in flowing deionized water for 1 minute. The three films were rendered hydrophilic as evidenced by a thin uniform layer of water which formed on the surfaces thereof. The films and slide were air dried and then selectively exposed through a quartz mask to a low-pressure mercury discharge lamp (total energy = 50 millijoules/cm$^2$) to form a hydrophobic surface pattern which was not wet upon subsequent immersion in a water bath at 5°C for up to 10 minutes (as evidenced upon removal from the bath by the absence of a covering layer of water on the radiation exposed surface pattern).

EXAMPLE III

The procedure of Example II was repeated except that the wetting solution comprised colloidal particles of a hydrous oxide of In. The solution was prepared in the following manner. One weight percent of indium trichloride was dissolved in 100 ml. of deionized water and the pH of the resultant solution was raised to about 3 with 0.5 to 1.0 N NaOH.

A hydrophobic pattern was obtained on the glass slide and the three films, respectively.

EXAMPLE IV

The procedure of Example II was repeated except that the wetting solution comprised colloidal particles of a hydrous oxide of Cr. The solution was prepared in the following manner. One-half weight percent of chromic chloride ($CrCl_3.6H_2O$) was dissolved in 100 ml. of deionized water and the initial pH of the resultant solution was raised to about 5.0–5.2 with 1N NaOH.

A hydrophobic pattern was obtained on each of the four samples (the glass slide and the three polymeric films).

EXAMPLE V

The procedure of Example II was repeated except that the wetting solution comprised colloidal particles of a hydrous oxide of Co. The solution was prepared in the following manner. One weight percent of cobalt chloride [$CoCl_2.6H_2O$] was dissolved in 100 ml. of deionized water and the initial pH was raised to 7.9 by the addition of $NH_4OH$ (1N).

A hydrophobic pattern was obtained on each of the four samples (the glass slide and the three polymeric films).

EXAMPLE VI

The procedure of Example II was repeated except that the wetting solution comprised colloidal particles of a hydrous oxide of Ni. The solution was prepared in the following manner. One-half weight percent of nickle acetate was dissolved in 100 ml. of deionized water and the initial pH was raised to 8.2–8.4 by the addition of $NH_4OH$ (1N).

A hydrophobic pattern was obtained on each of the four samples (the glass slide and the three polymeric films).

EXAMPLE VII

The procedure of Example II was repeated except that the wetting solution comprised colloidal particles of a hydrous oxide of Tl. The solution was prepared in the following manner. One weight percent of $TlCl_3$ was dissolved in 100 ml. of deionized water and the initial pH was raised to 3.7 by the addition of NaOH (1N).

A hydrophobic pattern was obtained on each of the four samples (the glass slide and the three polymeric films).

EXAMPLE VIII

The procedure of Example II was repeated except that the wetting solution comprised colloidal particles of a hydrous oxide of Zn. The solution was prepared in the following manner. One weight percent of zinc chloride [$ZnCl_2$] was dissolved in 100 ml. of deionized water and the initial pH was raised to 4.5—4.7.

A hydrophobic pattern was obtained on each of the four samples (the glass slide and the three polymeric films).

EXAMPLE IX

The procedure of Example II was repeated except that the wetting solution comprised colloidal particles of a hydrous oxide of Sn. The solution was prepared in the following manner. One weight percent of stannic chloride [$SnCl_4.5H_2O$] was dissolved in 100 ml. of an aqueous solution comprising 0.5 mole of HCl. The pH of the resultant solution was raised to 0.9–1.4 by the addition of NaOH (1N) thereto.

A hydrophobic pattern was obtained on each of the four samples (the glass slide and the three polymeric films).

EXAMPLE X

The procedure of Example II was repeated except that the wetting solution comprised colloidal particles of a hydrous oxide of Fe. The solution was prepared in the following manner. One weight percent of ferric chloride [$FeCl_3 \cdot 6H_2O$] was dissolved in 100 ml. of deionized water, the dissolution being aided by gradually heating to about 50°–80°C and stirring to obtain a wetting solution at a pH of 1.7–1.9. The intensity for the low-pressure mercury discharge lamp was 0.5 watt/cms. for 10 seconds.

A hydrophobic pattern was obtained on each of the four samples (the glass slide and the three polymeric films).

EXAMPLE XI

The procedure of Example X was repeated except that the wetting solution comprising colloidal particles of a hydrous oxide of Fe was prepared in the following manner. One-half weight percent of ferric chloride [$FeCl_3 \cdot 6H_2O$] was dissolved in 100 ml. of deionized water. The final pH of the resultant solution was adjusted to about 1.5–2.0 with HCl and the solution was heated to 70°C within 20 minutes.

A hydrophobic pattern was obtained on each of the four samples (the glass slide and the three polymeric films).

EXAMPLE XII

The procedure of Example X was repeated except the wetting solution comprised colloidal particles of a hydrous oxide of Cu. The solution was prepared in the following manner. One weight percent of cupric chloride [$CuCl_2$] was dissolved in 100 ml. of of deionized water and the initial pH of the resultant solution was raised to 7.4–7.8 by the addition of $NH_4OH$ (1N) thereto.

A hydrophobic pattern was obtained on each of the four samples (the glass slide and the three polymeric films).

EXAMPLE XIII

A glass side, commercially obtained, was coated with a wetting solution comprising colloidal particles of a hydrous oxide of In. The colloidal wetting solution was prepared in the following manner. One weight percent of indium trichloride was dissolved in 100 ml. of deionized water and the pH of the resultant solution was raised to about 3 with NaOH. The glass slide was immersed in the resultant wetting solution at 25°C for 10 seconds. The coated slide was water rinsed for 1 minute, air dried and then selectively exposed through a quartz mask to a source of ultraviolet radiation as described in Example II. The selectively images slide was sprayed with a mist of water which adhered only to the radiation unexposed areas of the slide. A commercially obtained alkyd based priting ink was then rolled onto the slide and retained only on the ultraviolet radiation exposed areas of the slide to form an ink pattern thereon.

EXAMPLE XIV

The procedure of Examle XIII was repeated except that the commercially obtained printing ink had carbon particles dispersed therethrough. The resultant conductive ink pattern was then subjected to a conventional electroplating treatment to obtain a copper pattern having a thickness of bout 1 mil.

EXAMPLE XV

The procedure of Example XIV was repeated except that the ink had silver particles dispersed therethrough. The resultant catalytic ink pattern was then exposed to a commercially obtained electroless copper plating bath whereby a $4\mu$-inch electroless copper pattern was obtained.

EXAMPLE XVI

The procedure of Example XIII was repeated except that after the radiation exposure, a water-based ink comprising a 1–2 weight percent polyvinyl alcohol solution was rolled onto the imaged slide. A water-based ink pattern was obtained comprising only the ultraviolet radiation unexposed areas of the slide.

EXAMPLE XVII

The procedure of Example XVI was repeated except that the water-based ink comprised a 1–2 weight percent gelatin solution. The water-based ink was retained only on the unexposed areas of the glass slide.

What is claimed is:

1. A method of forming a hydrophobic surface pattern on a surface, which comprises:
    coating the surface with a stable aqueous colloidal wetting sol, formed by a hydrolysis and nucleation reaction, comprising insoluble hydrous oxide particles of an element selected from the group consisting of Be, In, Cr, Fe, Co, Ni, Tl, Cu, Zn, Sn and mixtures thereof, to form a coated surface of hydrophilic character; and
    selectively exposing said coated surface to a source of ultraviolet radiation having a wavelength ranging from 1800A to 3300A to render exposed portions hydrophobic to form the hydrophobic surface pattern.

2. A method of preparing a printing master, which comprises:
    a. coating a surface with a stable aqueous colloidal wetting sol, formed by a hydrolysis and nucleation reaction, comprising insoluble hydrous oxide particles of an element selected from the group consisting of Be, In, Cr, Fe, Co, Ni, Tl, Cu, Zn, Sn and mixtures thereof to form a coated surface of hydrophilic character, to form a coated surface of hydrophilic character; and
    b. selectively exposing portions of said coated, hydrophilic surface to a source of ultraviolet radiation having a wavelength ranging from 1800A to 3300A to render regions thereof hydrophobic and to delineate an ink retaining surface pattern.

* * * * *

UNITED STATES PATENT OFFICE
CERTIFICATE OF CORRECTION

Patent No. 3,964,906     Dated June 22, 1976

Inventor(s) J. T. Kenney

It is certified that error appears in the above-identified patent and that said Letters Patent are hereby corrected as shown below:

In the specification, Column 1, line 16, " wettable and hydrophilic " should read -- "wettable" and "hydrophilic" --; line 18, " non-wettable and hydrophobic " should read -- "non-wettable" and "hydrophobic" --; line 20, " practical wetting " should read -- "practical wetting" --; line 21, " practical wetting " should read -- "practical wetting" --; lines 30 and 31, " practical wetting " should read -- "practical wetting" --; line 62, " practical wetting " should read -- "practical wetting" --; line 68, " beads up" should read -- "beads up" --. Column 2, line 6, "$\nu = 0°$" should read --$\theta = 0°$--; lines 10 and 11, " practical wetting " should read -- "practical wetting" --; lines 60 and 61, "hydrophobic" should read --hydrophobic)--. Column 4, line 13, "havig" should read --having--; line 17, " hydrous oxide " should read -- "hydrous oxide" --; line 21, " hydrous oxide " should read -- "hydrous oxide" --; line 40, " hydrous oxide " should read -- "hydrous oxide" --; line 49, " hydrous $H_2O$ " should read -- "hydrous $H_2O$" --. Column 5, line 2, "$[Cr(H_2O)_4Cl_27]$" should read --$[Cr(H_2O)_4Cl_2]$--; line 16, "ether" should read --either--; line 28, "bout" should read --about--. Column 6, line 15, "coverts" should read --converts--; line 65, "tht the" should read --that the--. Column 7, line 37, "substrte" should read --substrate--. Column 9, line 56, "5°C" should read --25°C--. Column 11, line 1, "0;9" should read --0.9--; line 49, "side" should read --slide--. Column 12, line 10, "bout" should read --about--.

In the claims, Column 12, lines 56 through 58, claim 2, "to form a coated surface of hydrophilic character, to form a coated surface of hydrophilic character" should read --to form a coated surface of hydrophilic character--.

Signed and Sealed this

Sixteenth Day of November 1976

[SEAL]

Attest:

RUTH C. MASON
Attesting Officer

C. MARSHALL DANN
Commissioner of Patents and Trademarks